US011737191B2

(12) United States Patent
Archer et al.

(10) Patent No.: US 11,737,191 B2
(45) Date of Patent: Aug. 22, 2023

(54) SEMI-CLOSED LOOP CURRENT SENSE AND CORRECTION

(71) Applicant: ERP POWER, LLC, Moorpark, CA (US)

(72) Inventors: Michael Archer, Moorpark, CA (US); Louis Chen, Simi Valley, CA (US); James H. Mohan, Valencia, CA (US)

(73) Assignee: ERP POWER, LLC, Moorpark, CA (US)

(*) Notice: Subject to any disclaimer, the term of this patent is extended or adjusted under 35 U.S.C. 154(b) by 0 days.

(21) Appl. No.: 17/718,155

(22) Filed: Apr. 11, 2022

(65) Prior Publication Data

US 2022/0338323 A1 Oct. 20, 2022

Related U.S. Application Data

(60) Provisional application No. 63/175,994, filed on Apr. 16, 2021.

(51) Int. Cl.
| | |
|---|---|
| *H05B 45/50* | (2022.01) |
| *G01R 19/165* | (2006.01) |
| *H05B 45/14* | (2020.01) |
| *H05B 45/3725* | (2020.01) |
| *H05B 45/355* | (2020.01) |

(52) U.S. Cl.
CPC ....... *H05B 45/50* (2020.01); *G01R 19/16571* (2013.01); *H05B 45/14* (2020.01); *H05B 45/355* (2020.01); *H05B 45/3725* (2020.01)

(58) Field of Classification Search
CPC ........ H05B 45/14; H05B 45/11; H05B 45/50; H05B 45/355; H05B 45/3725; G01R 19/16571
See application file for complete search history.

(56) References Cited

U.S. PATENT DOCUMENTS

| | | | |
|---|---|---|---|
| 2013/0313995 A1* | 11/2013 | Sadwick | H05B 47/10 315/307 |
| 2014/0265844 A1* | 9/2014 | Sadwick | H05B 45/3725 315/85 |
| 2014/0265900 A1* | 9/2014 | Sadwick | H05B 45/395 315/200 R |
| 2017/0118809 A1* | 4/2017 | Archer | H05B 45/10 |
| 2018/0020521 A1* | 1/2018 | Hegde | H05B 47/10 |
| 2019/0166671 A1* | 5/2019 | Hsia | H05B 47/11 |
| 2020/0413513 A1* | 12/2020 | Mohan | H05B 45/355 |
| 2021/0120649 A1* | 4/2021 | DeJonge | H05B 45/382 |

FOREIGN PATENT DOCUMENTS

CN 109362157 A * 2/2019 ............. H05B 45/10

* cited by examiner

*Primary Examiner* — Abdullah A Riyami
*Assistant Examiner* — Syed M Kaiser
(74) *Attorney, Agent, or Firm* — Lewis Roca Rothgerber Christie LLP

(57) ABSTRACT

A light driver includes a converter configured to generate a drive current based on a rectified input signal for driving a light source, and an output correction circuit coupled to an output of the converter and configured to measure the drive current and to generate a correction signal to dynamically control a DC-level of the drive current of the converter based on the drive current and a reference signal corresponding to a desired DC-level of the drive current.

20 Claims, 3 Drawing Sheets

SEMI-CLOSED LOOP CURRENT SENSE AND CORRECTION

CROSS-REFERENCE TO RELATED APPLICATION(S)

This application claims priority to and the benefit of U.S. Provisional Patent Application No. 63/175,994, filed in the United States Patent and Trademark Office on Apr. 16, 2021, the entire disclosure of which is incorporated by reference herein.

FIELD

Aspects of the present invention are related to light drivers for light sources.

BACKGROUND

A light emitting diode (LED) is an electronic device that converts electrical energy (commonly in the form of electrical current) into light. The light intensity of an LED is primarily based on the magnitude of the driving current. Given that an LED luminosity is very sensitive to drive current changes, in order to obtain a stable luminous output without flicker, it is desirable to drive LEDs by a constant-current source.

Generally, lighting sources are powered by an input AC voltage of 110 or 220 VAC at 50 or 60 Hz line frequency. The input AC voltage is rectified via a rectifier and converted to a desired output current level that will be utilized by the LED. As any input power ripple may induce an output voltage ripple and output current ripple, a feedback loop that measures the output of the converter may be used to implement ripple control and to adjust the output signal. However, the output ripple may affect the feedback loop in a way that causes the output signal to be at a DC value that does not reflect the desired value.

The above information disclosed in this Background section is only for enhancement of understanding of the invention, and therefore it may contain information that does not form the prior art that is already known to a person of ordinary skill in the art.

SUMMARY

Aspects of embodiments of the present disclosure are directed to a light driver utilizing a secondary-side output correction circuit that generates a feedback control signal, which allows the DC-DC converter to accurately set the DC level of the output signal despite the presence of output ripple. In some embodiments, the output correction circuit is capable of adjusting the feedback control signal based on measurements (e.g., real-time measurements) of the current output to the light source.

According to some embodiments of the present disclosure there is provided alight driver including: a converter configured to generate a drive current based on a rectified input signal for driving a light source; and an output correction circuit coupled to an output of the converter and configured to measure the drive current and to generate a correction signal to dynamically control a DC-level of the drive current of the converter based on the drive current and a reference signal corresponding to a desired DC-level of the drive current.

In some embodiments, the output correction circuit includes: a sense resistor in a current path of the drive current and configured to generate a sensed signal corresponding to the drive current; a signal amplifier coupled to the sense resistor and configured to generate an amplified signal by amplifying the sensed signal; and a reference generator configured to generate an adjusted reference signal based on the amplified signal and the reference signal.

In some embodiments, the output correction circuit further includes: an error amplifier configured to receive the adjusted reference signal and the sensed signal, and to generate the correction signal based on a difference between the adjusted reference signal and the sensed signal.

In some embodiments, the sense resistor is electrically coupled between an output terminal of the converter and the light source driven by the converter.

In some embodiments, the reference generator is configured to perform: calculating an average of the amplified signal over a period to generate an average signal; and generating the adjusted reference signal based on a difference between the reference signal and the average signal, wherein the reference signal corresponds to a target output current of the converter.

In some embodiments, the generating the adjusted reference signal includes: determining whether the average signal is less than the reference signal; in response to determining that the average signal is less than the reference signal, determining the adjusted reference signal as the reference signal plus a value corresponding to the difference between the reference signal and the average signal; and in response to determining that the average signal is greater or equal to the reference signal, determining the adjusted reference signal as the reference signal minus the value corresponding to the difference between the reference signal and the average signal.

In some embodiments, the reference generator includes: a memory configured to store the reference signal; an analog-to-digital (A/D) converter configured to receive the amplified signal and to generate a binary amplified signal; and a processor configured to calculate an average signal based on the binary amplified signal, and to calculate an adjusted binary reference signal based on the reference signal and the average signal.

In some embodiments, the reference generator further includes: a digital-to-analog (D/A) converter configured to convert the adjusted binary reference signal to the adjusted reference signal for transmission to an error amplifier.

In some embodiments, the reference generator further includes: a pulse-width modulator configured to convert the adjusted binary reference signal into a pulse-width modulated signal, wherein a filter converts the pulse-width modulated signal to the adjusted reference signal for transmission to an error amplifier.

In some embodiments, the reference generator is configured to perform a comparison of the amplified signal with a threshold and to generate an amplification selection signal based on the comparison, and wherein the signal amplifier has a variable gain and is configured to set the variable gain in response to the amplification selection signal.

In some embodiments, the reference generator is configured to generate the amplification selection signal having a first level in response to determining that the amplified signal is less than the threshold, and to generate the amplification selection signal having a second level in response to determining that the amplified signal is greater than or equal to the threshold, and the signal amplifier is configured to amplify the drive current with a first gain in response to receiving the amplification selection signal having the first level, and to amplify the drive current with a second gain in response to receiving the amplification selection signal having the second level.

In some embodiments, the signal amplifier includes: a non-inverting amplifier including a variable resistor, wherein the non-inverting amplifier is configured to have a first gain in response to the variable resistance having a first resistance, and to have a second gain in response to the variable resistance having a second resistance.

In some embodiments, the variable resistor is configured to receive an amplification selection signal from the reference generator, and to exhibit the first resistance in response to the amplification selection signal being at a first level, and to exhibit the second resistance in response to the amplification selection signal being at a second level.

In some embodiments, the signal amplifier includes: an operational amplifier having a first input terminal and a second input terminal, the first input terminal being coupled to the sense resistor; a first resistor coupled between the first input terminal and an output of the operational amplifier; and a variable resistor coupled to the second input terminal of the operational amplifier.

In some embodiments, the variable resistor includes: a second resistor coupled to the second input terminal of the operational amplifier; a third resistor coupled to the second input terminal; and a transistor coupled between the second and third resistors and having a gate terminal coupled to the reference generator and configured to receive an amplification selection signal from the reference generator.

In some embodiments, the transistor is configured to set a resistance of the variable resistor to a first resistance or a second resistance based on the amplification selection signal.

In some embodiments, the reference generator is configured to receive the reference signal from a dimming controller, the reference signal being based on a dimmer setting.

In some embodiments, the light driver further includes: a rectifier configured to rectify an input signal to generate the rectified input signal having a single polarity.

In some embodiments, the output correction circuit is configured to provide the correction signal to the converter, and the converter is configured to set a DC-level current of the drive current based on the correction signal.

In some embodiments, the light driver further includes: a power factor correction (PFC) controller coupled to a primary side of the converter, wherein the output correction circuit is configured to provide the correction signal to the PFC controller, and wherein the PFC controller is configured to regulate a DC-level current of the drive current based on the correction signal.

In some embodiments, the converter has a primary side and a secondary side electrically isolated from, and inductively coupled to, the primary side, wherein the output correction circuit is electrically isolated from a primary side of the converter, and wherein the output correction circuit is configured to communicate the correction signal to a primary side of the converter via an optocoupler.

BRIEF DESCRIPTION OF THE DRAWINGS

The accompanying drawings, together with the specification, illustrate example embodiments of the present invention, and, together with the description, serve to explain the principles of the present invention.

DETAILED DESCRIPTION

The detailed description set forth below is intended as a description of example embodiments of light driver (e.g., a light driver) with an output correction circuit and driver control system, provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1:
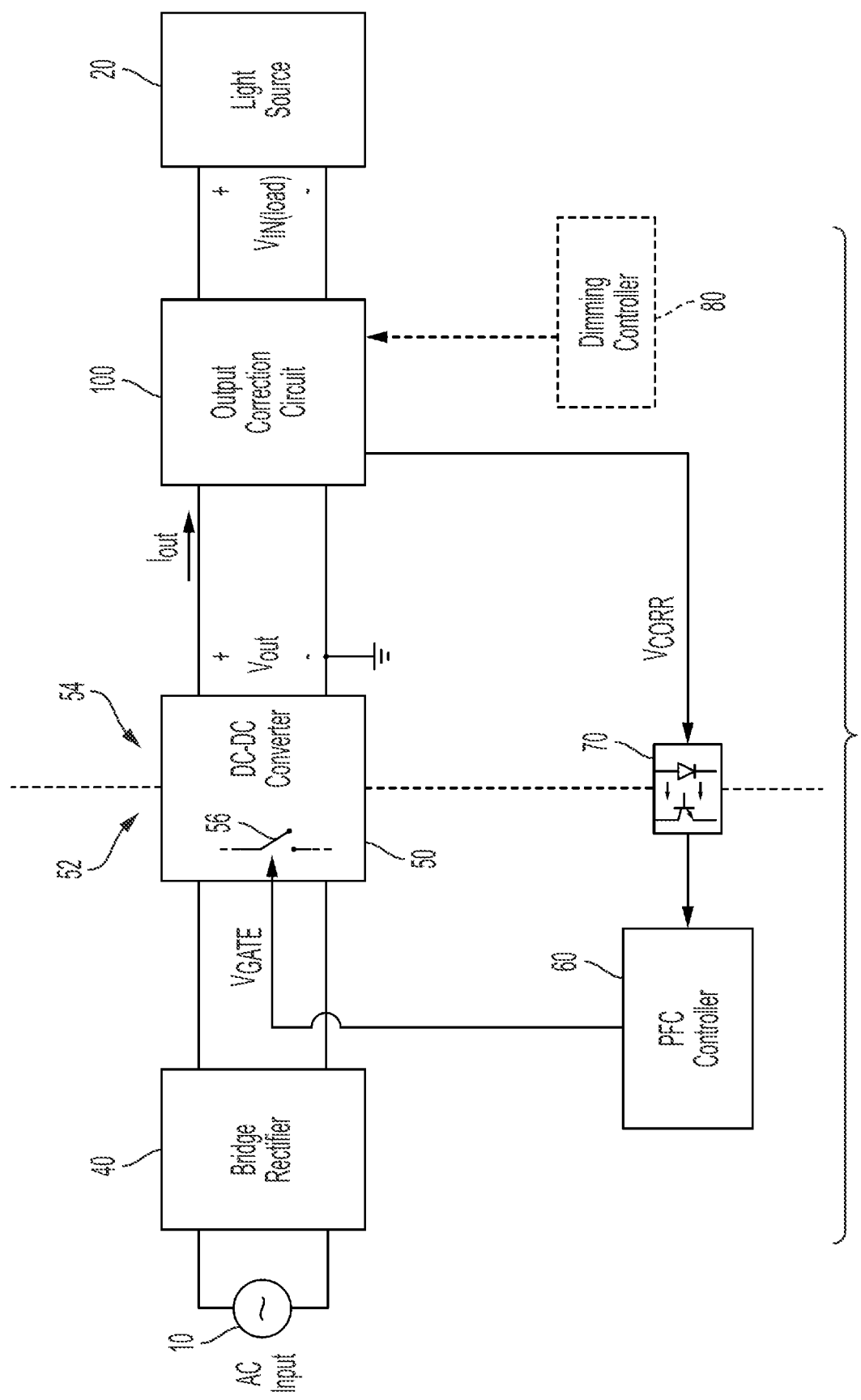
FIG. 1 illustrates a lighting system including a light driver having an output correction circuit, according to some example embodiments of the present disclosure.

FIG. 1 illustrates a lighting system 1 including a light driver 30 having an output correction circuit 100, according to some example embodiments of the present disclosure.

According to some embodiments, the lighting system 1 includes an input source 10, a light source 20, and a light driver 30 (e.g., a switched-mode power supply) for powering and controlling the brightness of the light source 20 based on the signal from the input source 10.

The input source 10 may include an alternating current (AC) power source that may operate at a voltage of 100 Vac, 120 Vac, 240 Vac, or 277 Vac, for example. The input source 10 may also include a dimmer electrically powered by said AC power sources. The dimmer may modify (e.g., cut/chop a portion of) the input AC signal according to a dimmer level before sending it to the light driver 30, and thus variably reduces the electrical power delivered to the light driver 30 and the light source 20. In some examples, the dimmer may be a TRIAC or ELV dimmer, and may chop the front end or leading edge of the AC input signal. According to some examples, the dimmer interface may be a rocker interface, a tap interface, a slide interface, a rotary interface, or the like. A user may adjust the dimmer level by, for example, adjusting a position of a dimmer lever or a rotation of a rotary dimmer knob, or the like. The light source 20 may include one or more light-emitting-diodes (LEDs) or an arc or gas discharge lamp with electronic ballasts, such as high intensity discharge (HID) or fluorescent lights.

In some embodiments, the light driver 30 includes a rectifier 40, a converter 50, and an output correction circuit (e.g., a secondary-side output correction circuit) 100.

The rectifier 40 may provide a same polarity of output for either polarity of the AC signal from the input source 10. In some examples, the rectifier 40 may be a full-wave circuit using a center-tapped transformer, a full-wave bridge circuit with four diodes, a half-wave bridge circuit, or a multi-phase rectifier.

The converter (e.g., the DC-DC converter) 50 converts the rectified AC signal generated by the rectifier 40 into a drive signal for powering and controlling the brightness of the light source 20. The drive signal may depend on the type of the one or more LEDs of the light source 20. For example, when the one or more LEDs of the light source 20 are constant current LEDs the drive signal may be a variable voltage signal, and when the light source 20 requires constant voltage, the drive signal may be a variable current signal. In some embodiments, the converter 50 includes a boost converter for maintaining (or attempting to maintain) a constant DC bus voltage on its output while drawing a current that is in phase with and at the same frequency as the line voltage (by virtue of the power factor correction (PFC) controller 60). Another switched-mode converter (e.g., a transformer) inside the converter 50 produces the desired output voltage from the DC bus. The converter has a primary side 52 and a secondary side 54 that is electrically isolated from, and inductively coupled to, the primary side 52. In some examples, the PFC controller 60 may be configured to improve (e.g., increase) the power factor of the load on the input source 10 and reduce the total harmonic distortions (THD) of the light driver 30. The PFC controller 60 may be external to the converter 50, as shown in FIG. 1, or may be internal to the converter 50.

According to some embodiments, the output correction circuit 100 monitors the output (e.g., the output current) of the converter 50 on the secondary side and issues a correction signal that is fed back into the primary side 52 of the light driver 30. The correction signal may be utilized by the PFC controller 60 to drive the main switch 56 within the converter 50, which determines the DC output level of the light driver 30.

The light driver 30 may not be able to produce a perfect DC signal at its output and ripples may be present in the output. For example, there may be an inherent sine wave ripple at the output signal, which originates from the line input voltage that is supplied to the light driver 30. The voltage ripples may affect the DC output voltage and current of the light driver 30, and the peak-to-peak current ripples may vary significantly depending on load. For example, the output signal may exhibit a smaller peak-to-peak ripple at high voltage/current loads (e.g., when at high brightness settings or driving a high-voltage LED) and a relatively larger peak-to-peak ripple at low voltage/voltage loads (e.g., when at low driver settings or driving a low-voltage LED). In the related art, this ripple may affect the operation of the feedback loop and lead to an error in the DC level of the output signal. That is, the DC level of the output signal may deviate from the desired output value (as, e.g., determined by a brightness setting). For example, when the desired dimmer setting is at 50%, the ripple at the output of the light driver 30 may cause the output level to be at 49% and not the desired 50%. This error may be particularly pronounced in single stage topologies using a PFC, such as flyback topologies, pure buck converters, or buck-boost converters.

According to some embodiments, the output correction circuit 100 corrects for this error to ensure that the DC level of the output signal accurately represents the desired setting. In some embodiments, the output correction circuit 100 measures the output current (e.g., instantaneous output current) $I_{OUT}$ of the converter 50, averages the measured output current over a period of time, and adjusts (e.g., increases or decreases) a reference signal that corresponds to the desired output based on the average output current $I_{OUT}$. The difference (i.e., error) between the adjusted reference signal and the measured output current $I_{OUT}$ is used to generate the correction signal. In some embodiments, the correction signal is used to dynamically control a DC-level of the output signal of the converter 50 based on the measured current and the adjusted reference signal, which corresponds to the desired DC-level of the output signal.

In some examples, an optocoupler 70 communicates the control signal (also referred as a correction signal) from the output correction circuit 100 on the secondary side 54 to the primary side 52, while maintaining the electrical isolation between the two sides.

Figure 2A:
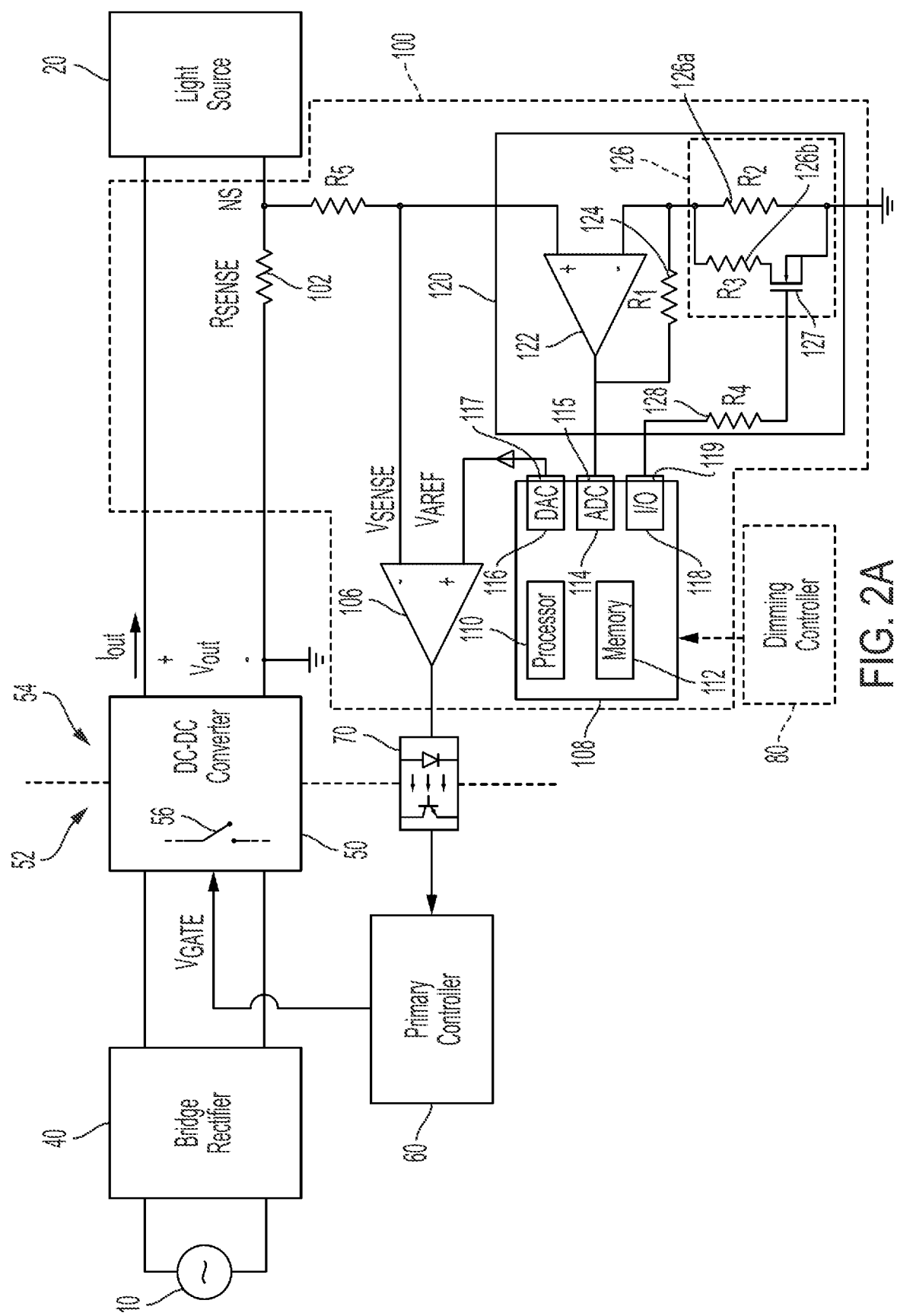
FIG. 2A is a schematic diagram illustrating the output correction circuit within the light driver, according to some example embodiments of the present disclosure.
Figure 2B:
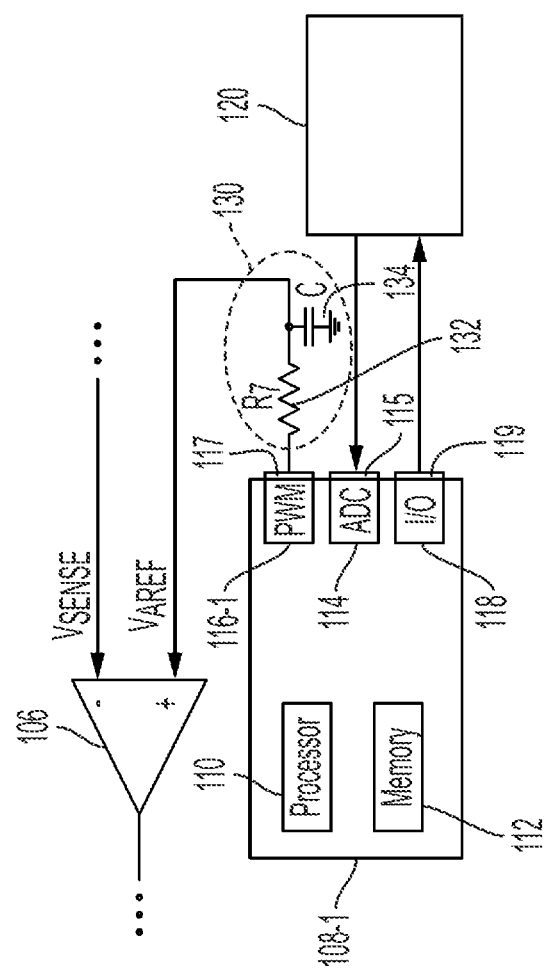
FIG. 2B is a schematic diagram illustrating a reference generator of the output correction circuit 100, according to some embodiments of the present disclosure.

FIG. 2A is a schematic diagram illustrating the output correction circuit 100 within the light driver 30, according to some example embodiments of the present disclosure. FIG. 2B is a schematic diagram illustrating the reference generator of the output correction circuit 100, according to some embodiments of the present disclosure.

According to some embodiments, the output correction circuit 100 is electrically coupled to the secondary side 54 of the converter 50 and electrically isolated from the primary side 52. The output correction circuit 100 measures the drive current $I_{OUT}$ that is output by the converter 50 and generates a correction signal to dynamically control a DC-level of the drive current of the converter based on the measured drive current and a reference signal corresponding to a desired DC-level of the drive current. In some embodiments, the output correction circuit 100 includes a sense resistor 102, an error amplifier (e.g., an analog error amplifier) 106, and a reference generator (e.g., a reference current generator) 108 and a signal amplifier 120.

The sense resistor 102 may be positioned between an output terminal (e.g., a reference/ground terminal) of the converter 50 and the light source 20 and is connected electrically in series with the light source 20 (e.g., at its negative input). In some examples, the sense resistor may be about 50 mΩ to about 1Ω. As the sense resistor 102 is in a current path of the drive current $I_{OUT}$, the voltage ($V_{SENSE}$) at an end of the resistor 102 that is connected to light source 20 at node $N_S$ corresponds to the drive current $I_{OUT}$. For example, $$I_{OUT}=V_{SENSE}/R_{SENSE} \tag{1}$$

As the sense signal $V_{SENSE}$ may be too small to measure accurately, the signal amplifier 120 is utilized to amplify the sensed signal and to supply the amplified signal to the reference generator 108 for processing. The reference generator 108 then generates an adjusted reference signal (e.g., an adjusted reference current/voltage) $V_{AREF}$ based on the amplified signal and a reference signal, which corresponds to a desired DC-level of the drive current. The error amplifier 106 also receives the sense signal $V_{SENSE}$ (e.g., at the negative input terminal of the error amplifier 106 via the fifth resistor $R_5$) in real-time and compares this signal to the adjusted reference signal and generates a correction signal (also referred to as a corrected control signal) $V_{CORR}$ based on a difference (e.g., error) between the sensed signal and the adjusted reference signal. The correction signal $V_{CORR}$ that is then generated by the error amplifier 106 is used by the PFC controller 60 to control the main gate 56 of the converter 50 (e.g., via a gate control signal $V_{GATE}$), which in turn controls/adjusts the voltage level of the converter output $V_{OUT}$. In some examples, the optocoupler 70 transmits the correction signal $V_{CORR}$ across the primary-secondary barrier to the PFC controller 60, while maintaining electrical isolation between the primary and secondary sides 52 and 54.

Due to the AC line-in voltage provided to the light driver 30, the drive current $I_{OUT}$ may have an inherent sine wave ripple, which may be at twice the line frequency (e.g., be at 120 Hz). The peak-to-peak current ($I_{P-P}$) ripples may vary significantly depending on load. As the ripples may be large in amplitude (e.g., 30-60%, where % ripple is defined as (($I_{P-P}$)/2)/Iavg, and Iavg is the average DC current level), the non-linear gain of the error amplifier (which may be linear for small ripples), may cause the peak of the current ripple to experience a different gain from another part of the current ripple. In other words, because of the change in gain experienced by the sensed signal, the error amplifier 106 may not observe the correct center point for the current ripple. If the error amplifier 106 compares this sensed signal directly with the reference signal (rather than the adjusted reference signal), the error amplifier 106 may regulate the loop at a point along the rippled signal that is lower or higher than the actual center of the drive current waveform. For example, the error amplifier 106 may regulate the DC level of the drive current $I_{OUT}$ to about 10% lower than the desired level, in such a scenario. The DC level regulation error (or DC offset) may be less at lower current ripples. According to some embodiments, the reference generator 108 corrects for this DC offset by increasing or decreasing the reference signal by way of the adjusted reference signal.

According to some embodiments, the reference generator 108 monitors (e.g., continually monitors) the amplified sensed signal and calculates an average of the amplified signal over a period of time to generate an average signal. The averaging period may be a value between about 100 ms to about 500 ms. The average signal may be a close approximation of the DC value of the drive current $I_{OUT}$. The reference generator 108 then generates the adjusted reference signal based on a difference between the average signal and the desired reference signal, which corresponds to the desired target output current of the converter.

In generating the adjusted reference signal, in some embodiments, the reference generator 108 first compares the reference signal and the average signal. When the average signal is less than the reference signal, the reference generator 108 determines the adjusted reference signal as the reference signal plus an error correction value corresponding to the difference between the reference signal and the average signal. When the average signal is greater or equal to the reference signal, the reference generator 108 determines the adjusted reference signal as the reference signal minus the error correction value corresponding to the difference between the reference signal and the average signal. By calculating the error/difference between the desired reference signal and the calculated mean value, and increasing or decreasing the reference signal proportional to the error, the processor 110 may reduce the error to within an acceptable limit over time. In some examples, the acceptable limit may be +/−2%, +/−4%, +/−5%, or any other suitable value, according to the desired application.

According to some embodiments, the reference generator 108 includes a processor (e.g., a programmable microprocessor) 110, a memory (e.g., a storage memory) 112, an analog-to-digital (A/D) converter 114 at an input terminal (e.g., a sample terminal) 115, a digital-to-analog (D/A) converter 116 at a first output terminal 117, and an input/output (I/O) port 118 at a second output terminal 119. The sample terminal of the reference generator 108 is electrically coupled the output of the signal amplifier 120 and samples (e.g., measures) the amplified signal. The A/D converter 114 converts the readings to digital binary form for further processing by the processor 110.

In some embodiments, processor 110 calculates the average signal based on the measurements captured by the A/D converter 114 and uses it to modify/adjust a reference signal that corresponds to the DC value that the output signal (e.g., the drive current) of the converter 50 is to be regulated to. The D/A converter 116 converts the adjusted reference signal, which may be in digital binary format, to an analog signal to be supplied to the error amplifier 106 (e.g., to the positive input terminal of the error amplifier 106) via the output terminal 117. In some examples, the analog-to-digital (A/D) converter 114 converts the received the amplified signal to a binary amplified signal, which the processor 110 uses to calculated the average signal and an adjusted binary reference signal. The digital-to-analog (D/A) converter 116 converts this adjusted binary reference signal to the adjusted reference signal for transmission to the error amplifier 106.

The reference signal $V_{REF}$ may be a fixed/constant value stored at the memory 112 or may be variable signal provided from an external circuit. In examples in which the light source 20 is a dimmable light (e.g., a dimmable LED), a dimming controller 80 may generate the reference signal $V_{REF}$ based on a dimmer setting (e.g., a brightness setting ranging from 0-100%) and provide the signal to the processor 110.

In some examples, the sense signal may have a magnitude (e.g., about 100 mV) that is much lower than that input range (e.g., than that of the bias voltage) of the A/D converter 114 (e.g., about 3.3 V), which may make it difficult for A/D converter 114 to accurately measure the changes in sensed signal due to the limited resolution of the A/D converter 114. Accordingly, in some embodiments, the signal amplifier 120 amplifies the sensed signal to a value closer to the quantization reference of the A/D converter 114 (e.g., closer to 3.3 V), which allows the A/D converter 114 to more accurately measure changes in the amplified signal.

In some embodiments, the signal amplifier 120 includes an operational amplifier 122 having a first input terminal (e.g., a positive input terminal) coupled to the sense resistor 102 and a second input terminal (e.g., a negative input terminal); a first resistor (e.g., a feedback resistor) 124 coupled between the first input terminal and an output of the operational amplifier 122; and a variable resistor (e.g., a bi-state resistor) 126 coupled to the second input terminal of the operational amplifier. The operational amplifier 122, the first resistor 124, and the variable resistor 126 together form a non-inverting amplifier having a variable gain. The variable resistor 126 may exhibit a first resistance or a second resistance depending on an amplification selection signal received from the reference generator 108. In some examples, the first resistor 124 may have a value of about 100 kΩ. The signal amplifier 120 exhibits a first gain when the variable resistance has a first resistance, and exhibits a second gain when the variable resistance has a second resistance. In some examples, the first gain may be about 14.33 and the second gain may be about 26.67.

In some embodiments, the variable resistor 126 includes a second resistor 126a coupled to the second input terminal of the operational amplifier 122, a third resistor 126b coupled to the second input terminal, and a transistor (e.g., a field effect transistor) 127 coupled between the second and third resistors 126a and 126b, which has a gate terminal coupled to the reference generator 108 (e.g., to the I/O port of the reference generator 108 through the fourth resistor 128) and is configured to receive the amplification selection signal. In some examples, the second and third resistors 126a and 126b may each have a value of about 7.5 kΩ. The amplification selection signal can activate/deactivate the transistor and set the effective resistance of the variable resistor to a first resistance (e.g., $R_2 \| R_3$) or a second resistance ($R_2$) based on the amplification selection signal. In some examples, the variable resistor 126 is configured to exhibit the first resistance in response to the amplification selection signal being at a first level (e.g., a high level or binary '1'), and to exhibit the second resistance in response to the amplification selection signal being at a second level (e.g., a low level or binary '0').

Having the ability to amplify the sensed signal using two different gain values allows the processor 110 to more accurately monitor the drive current at both lower and higher current values. In determining the appropriate gain value, the processor 110 compares the amplified signal with a threshold (e.g., 500 mV) and generates the amplification selection signal based on the comparison. For example, the processor 110 generates an amplification selection signal having the first level (e.g., a high level or binary '1') in response to determining that the amplified signal is less than the threshold, which increases the amplification gain of the signal amplifier 120 and in turn increases the signal level of the amplified signal. Here, the first gain $Av_1$ may be expressed as:

$$Av_1=1+R_1/(R_2\|R_3) \quad (2)$$

This ensures that the level of the amplified signal is closer to the full scale of input range of the A/D converter 114, which allows for more accurate measurements. Further, the processor 110 generates an amplification selection signal having the second level (e.g., a low level or binary '0') in response to determining that the amplified signal is greater than or equal to the threshold, which decreases the amplification gain of the signal amplifier 120 and in turn decreases the signal level of the amplified signal.

Here, the second gain $Av_2$, which is less than the first gain, may be expressed as:

$$Av_2=1+R1/R2 \quad (3)$$

This ensures than the amplified signal does not get clipped by the A/D converter 114 by exceeding the input range of the A/D converter 114.

As illustrated in FIG. 2A, the output terminal 117 of the reference generator 108 provides the adjusted reference signal $V_{AREF}$, which is an analog signal, through the D/A converter 116. However, embodiments of the present disclosure are not limited thereto. For example, as is illustrated in FIG. 2B, the reference generator 108-1 includes a pulse-width modulator (PWM) 116-1 instead of the D/A converter 116, which generates a pulse-width modulated signal corresponding to the adjusted reference signal. A low-pass filter 130 may be utilized to convert the pulse-width modulated signal to the adjusted reference signal. In some examples, the low-pass filter 130 may include a seventh resistor ($R_7$) 132 and a capacitor 134; however, embodiments of the present disclosure are not limited thereto, and any suitable low-pass filter circuit may be utilized.

According to some embodiments, the amount by which the reference signal is adjusted by the reference generator 108 also includes a calibration offset that accounts for the inherent offset error of the A/D converter 114, and the tolerances of the signal amplifier resistors, the sense resistor, the bias voltage (e.g., the 3.3 V bias) supplied to the A/D converter 114, etc.

Accordingly, as described above, the light driver 30 utilizes the output correction circuit 100 to compensate for the deviation caused in the DC-level of the drive current of the light driver by the ripple present in the output signal. By compensating for the effect of ripple on the feedback loop, the adjusted reference signal may lead to an output current $I_{OUT}$ whose DC level more closely matches (e.g., to within 1% of) the desired output DC level (as, e.g., determined by the dimmer setting) than the original reference signal.

It will be understood that, although the terms "first", "second", "third", etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section, without departing from the spirit and scope of the inventive concept.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include", "including", "comprises", and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Further, the use of "may" when describing embodiments of the inventive concept refers to "one or more embodiments of the inventive concept". Also, the term "exemplary" is intended to refer to an example or illustration.

As used herein, the terms "use", "using", and "used" may be considered synonymous with the terms "utilize", "utilizing", and "utilized", respectively.

The light driver with the output correction circuit and/or any other relevant devices or components according to embodiments of the present invention described herein may be implemented by utilizing any suitable hardware, firmware (e.g., an application-specific integrated circuit), software, or a suitable combination of software, firmware, and hardware. For example, the various components of the independent multi-source display device may be formed on one integrated circuit (IC) chip or on separate IC chips. Further, the various components of the LED driver may be implemented on a flexible printed circuit film, a tape carrier package (TCP), a printed circuit board (PCB), or formed on the same substrate. Further, the various components of the LED driver may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer-readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

While this invention has been described in detail with particular references to illustrative embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims and equivalents thereof.

What is claimed is:

1. A light driver comprising:
a converter configured to generate a drive current based on a rectified input signal for driving a light source; and
an output correction circuit coupled to an output of the converter and configured to measure the drive current and to generate a correction signal to dynamically control a DC-level of the drive current of the converter based on the drive current and a reference signal corresponding to a desired DC-level of the drive current, the output correction circuit comprising:
a sense resistor in a current path of the drive current and configured to generate a sensed signal corresponding to the drive current;
a signal amplifier coupled to the sense resistor and configured to generate an amplified signal by amplifying the sensed signal; and
a reference generator configured to calculate an average signal based on the amplified signal and to generate an adjusted reference signal based on the amplified signal and the average signal.

2. The light driver of claim 1, wherein the output correction circuit further comprises:
an error amplifier configured to receive the adjusted reference signal and the sensed signal, and to generate the correction signal based on a difference between the adjusted reference signal and the sensed signal.

3. The light driver of claim 1, wherein the sense resistor is electrically coupled between an output terminal of the converter and the light source driven by the converter.

4. The light driver of claim 1, wherein the reference generator is configured to perform a comparison of the amplified signal with a threshold and to generate an amplification selection signal based on the comparison, and
wherein the signal amplifier has a variable gain and is configured to set the variable gain in response to the amplification selection signal.

5. The light driver of claim 4, wherein the reference generator is configured to generate the amplification selection signal having a first level in response to determining that the amplified signal is less than the threshold, and to generate the amplification selection signal having a second level in response to determining that the amplified signal is greater than or equal to the threshold, and
wherein the signal amplifier is configured to amplify the drive current with a first gain in response to receiving the amplification selection signal having the first level, and to amplify the drive current with a second gain in response to receiving the amplification selection signal having the second level.

6. The light driver of claim 1, wherein the signal amplifier comprises:
a non-inverting amplifier comprising a variable resistor,
wherein the non-inverting amplifier is configured to have a first gain in response to the variable resistance having a first resistance, and to have a second gain in response to the variable resistance having a second resistance.

7. The light driver of claim 6, wherein the variable resistor is configured to receive an amplification selection signal from the reference generator, and to exhibit the first resistance in response to the amplification selection signal being at a first level, and to exhibit the second resistance in response to the amplification selection signal being at a second level.

8. The light driver of claim 1, wherein the signal amplifier comprises:
an operational amplifier having a first input terminal and a second input terminal, the first input terminal being coupled to the sense resistor;
a first resistor coupled between the first input terminal and an output of the operational amplifier; and
a variable resistor coupled to the second input terminal of the operational amplifier.

9. The light driver of claim 8, wherein the variable resistor comprises:
a second resistor coupled to the second input terminal of the operational amplifier;
a third resistor coupled to the second input terminal; and
a transistor coupled between the second and third resistors and having a gate terminal coupled to the reference generator and configured to receive an amplification selection signal from the reference generator.

10. The light driver of claim 9, wherein the transistor is configured to set a resistance of the variable resistor to a first resistance or a second resistance based on the amplification selection signal.

11. The light driver of claim 1, wherein the reference generator is configured to receive the reference signal from a dimming controller, the reference signal being based on a dimmer setting.

12. The light driver of claim 1, further comprising:
a rectifier configured to rectify an input signal to generate the rectified input signal having a single polarity.

13. The light driver of claim 1, wherein the output correction circuit is configured to provide the correction signal to the converter, and
wherein the converter is configured to set a DC-level current of the drive current based on the correction signal.

14. The light driver of claim 1, further comprising:
a power factor correction (PFC) controller coupled to a primary side of the converter,
wherein the output correction circuit is configured to provide the correction signal to the PFC controller, and
wherein the PFC controller is configured to regulate a DC-level current of the drive current based on the correction signal.

15. The light driver of claim 1, wherein the converter has a primary side and a secondary side electrically isolated from, and inductively coupled to, the primary side,
wherein the output correction circuit is electrically isolated from a primary side of the converter, and
wherein the output correction circuit is configured to communicate the correction signal to a primary side of the converter via an optocoupler.

16. A light driver comprising:
a converter configured to generate a drive current based on a rectified input signal for driving a light source; and
an output correction circuit coupled to an output of the converter and configured to measure the drive current and to generate a correction signal to dynamically control a DC-level of the drive current of the converter based on the drive current and a reference signal corresponding to a desired DC-level of the drive current,
wherein the output correction circuit comprises:
a sense resistor in a current path of the drive current and configured to generate a sensed signal corresponding to the drive current;

a signal amplifier coupled to the sense resistor and configured to generate an amplified signal by amplifying the sensed signal; and a reference generator configured to generate an adjusted reference signal based on the amplified signal and the reference signal, wherein the reference generator is configured to perform:

calculating an average of the amplified signal over a period to generate an average signal; and generating the adjusted reference signal based on a difference between the reference signal and the average signal, and wherein the reference signal corresponds to a target output current of the converter.

17. The light driver of claim 16, wherein the generating the adjusted reference signal comprises:

determining whether the average signal is less than the reference signal;

in response to determining that the average signal is less than the reference signal, determining the adjusted reference signal as the reference signal plus a value corresponding to the difference between the reference signal and the average signal; and in response to determining that the average signal is greater or equal to the reference signal, determining the adjusted reference signal as the reference signal minus the value corresponding to the difference between the reference signal and the average signal.

18. A light driver comprising:

a converter configured to generate a drive current based on a rectified input signal for driving a light source; and an output correction circuit coupled to an output of the converter and configured to measure the drive current and to generate a correction signal to dynamically control a DC-level of the drive current of the converter based on the drive current and a reference signal corresponding to a desired DC-level of the drive current, wherein the output correction circuit comprises:

a sense resistor in a current path of the drive current and configured to generate a sensed signal corresponding to the drive current;

a signal amplifier coupled to the sense resistor and configured to generate an amplified signal by amplifying the sensed signal; and a reference generator configured to generate an adjusted reference signal based on the amplified signal and the reference signal, wherein the reference generator comprises:

a memory configured to store the reference signal;

an analog-to-digital (A/D) converter configured to receive the amplified signal and to generate a binary amplified signal; and a processor configured to calculate an average signal based on the binary amplified signal, and to calculate an adjusted binary reference signal based on the reference signal and the average signal.

19. The light driver of claim 18, wherein the reference generator further comprises:

a digital-to-analog (D/A) converter configured to convert the adjusted binary reference signal to the adjusted reference signal for transmission to an error amplifier.

20. The light driver of claim 18, wherein the reference generator further comprises:

a pulse-width modulator configured to convert the adjusted binary reference signal into a pulse-width modulated signal, wherein a filter converts the pulse width modulated signal to the adjusted reference signal for transmission to an error amplifier.

* * * * *